United States Patent [19]
Fuderer et al.

[11] Patent Number: 5,534,777
[45] Date of Patent: Jul. 9, 1996

[54] METHOD AND APPARATUS FOR MAGNETIC RESONANCE IMAGING BY RADIALLY SCANNING THROUGH FREQUENCY SPACE AND EMPLOYING A CORRECTION IMAGE DERIVED FROM AN EDGE IMAGE

[75] Inventors: Miha Fuderer, Eindhoven; Dirk Van Ormondt, Delft, both of Netherlands

[73] Assignee: U.S. Philips Corporation, New York, N.Y.

[21] Appl. No.: 243,512

[22] Filed: May 16, 1994

[30]  Foreign Application Priority Data

May 18, 1993 [EP] European Pat. Off. ............. 93201419

[51] Int. Cl.⁶ ................................................. G01R 33/48
[52] U.S. Cl. ............................................................ 324/309
[58] Field of Search .................................... 324/300, 307, 324/309, 312, 314; 128/653.2

[56]  References Cited

U.S. PATENT DOCUMENTS

| | | | |
|---|---|---|---|
| 4,070,611 | 1/1978 | Ernst | 324/309 |
| 4,506,222 | 3/1985 | Edelstein et al. | 324/309 |
| 5,001,429 | 3/1991 | Constable et al. | 324/312 |
| 5,057,776 | 10/1991 | Macovski | 324/309 |
| 5,243,284 | 9/1993 | Noll | 324/309 |

OTHER PUBLICATIONS

"Radial Scanning Technique for Volume Selective P Spectroscopy" C. Rim et al Magnetic Resonance in Medicine 24, 100–108 (1992).

"A Fast Sinc Function Gridding Alogorithm for Fourier Inversion in Computer Tomography", by J. D. O'Sullivan, IEEE Trans. on Med. Imaging, vol. MI–4, No. 4, Dec. 1985, pp. 200–207.

"Ringing Artefact Reduction by an Efficient Likelihood Improvement Method", by M. Fuderer, SPIE, vol. 1137, 1989, pp. 84–90.

"NMR Imaging Methods Seen as Trajectories in the Reciprocal Space", by P. R. Locher, Bull. Mag. Reson. vol. 6, No. 3, Nov. 1984, pp. 140–141.

*Primary Examiner*—Sandra L. O'Shea
*Assistant Examiner*—Raymond Y. Mah
*Attorney, Agent, or Firm*—Jack D. Slobod

[57]  ABSTRACT

Nuclear or electron spin magnetic resonance method using multiple radial scans through frequency-space. The problem of insufficient sample density at the higher image frequencies is solved by deriving an edge image, determining a correction image therefrom by using a priori knowledge about the pixel value distribution and using the correction image after Fourier transformation to frequency-space.

16 Claims, 4 Drawing Sheets

METHOD AND APPARATUS FOR MAGNETIC RESONANCE IMAGING BY RADIALLY SCANNING THROUGH FREQUENCY SPACE AND EMPLOYING A CORRECTION IMAGE DERIVED FROM AN EDGE IMAGE

BACKGROUND OF THE INVENTION

1. Field of the Invention

The invention pertains to a method for deriving a magnetic resonance image of an object placed in a stationary and substantially homogeneous magnetic main field, comprising repeatedly exciting said object and sampling magnetic resonance signals in the presence of a read gradient superimposed on said main field thereby determining a first frequency image of said object on radius and angle coordinates by radially scanning through frequency-space. The invention also pertains to an apparatus to perform such method.

2. Description of the Related Art

A method as described in the preamble is known from the U.S. Pat. No. 4,070,611. In said patent is disclosed that magnetic resonance signals are induced in an object, notably a patient, present in a homogeneous magnetic field and are detected while exposing the region of the object to be imaged to a linear gradient superimposed on the homogeneous magnetic field. A resonance spectrum is obtained for each of a relatively large number of angularly displaced orientations of the linear gradient. The image is constructed by a mathematical process of back projection. This technique uses the fact that the Fourier transform of a one-dimensional projection of the spin density represents a one-dimensional cross-section of the three-dimensional Fourier transform of the spin density function.

In the article "NMR Imaging Methods Seen as Trajectories in the Reciprocal Space" in Bull. Magnetic Resonance, 6, No. 3, Nov. 1984, p. 140–141, is disclosed that the values of the magnetic resonance signal S(t) fundamentally correspond to the values of the Fourier transform of the spin density function in frequency-space at positions given by d$\underline{k}$/dt=$\gamma\underline{G}$, $\underline{k}$=$(k_x,k_y,k_z)$ determining the position in frequency-space (also called k-space), $\underline{G}$=$(G_x,G_y,G_z)$ determining the magnetic gradient, and $\gamma$ being the gyromagnetic ratio. So, in a method as described in the preamble, the values of a frequency image of an image to be produced are found as values of the detected signal assigned to points along a radial line in frequency-space.

In U.S. Pat. No. 4,070,611 mentioned above is explained that radially scanning through frequency-space has the distinct disadvantage that information is collected in an inhomogeneous way, i.e. because of the radial scanning the information is more dense near the origin of frequency-space, representing the lower frequencies, and there may be insufficient information of the higher image frequencies. In U.S. Pat. No. 4,070,611 a method is disclosed in which frequency-space is scanned along parallel lines. An improved version of this method is called spin warp and disclosed in U.S. Pat. No. 4,506,222.

However, especially under circumstances wherein the magnetic resonance signal has short decay times, which in case of nuclear (proton) magnetic resonance depends on the materials or tissues examined and which is almost always the case with electron spin resonance, it may be advantageous to start sampling of the magnetic resonance signal immediately after the end of the excitation. That is not possible with methods like spin warp and spin echo because in those methods an echo of the signal is used and time is needed to switch phase encoding gradients. So, especially in cases of short decay times, radial scanning may be very useful.

SUMMARY OF THE INVENTION

It is an object of the invention to provide a radial scan method as described in the preamble in which the drawback of the less dense information acquisition of the higher image frequencies (due to radial scanning) is mitigated.

Another object of the invention is to provide such method in which artefacts are greatly reduced.

Still another object of the invention is to provide such method in which the probability of the image based on its statistical properties is increased.

These and other objects of the invention are achieved in a method as described in the preamble by following steps:
  a) determining an edge image in image-space,
  b) deriving from said edge image a correction image in image-space with pixel values derived from pixel values of said edge image and a predetermined probability function of edge image values,
  c) determining a corrected frequency image in frequency-space,
  d) Fourier transforming said corrected frequency image to image-space.

It can be shown, by reference to the article "Ringing artefact reduction by an efficient likelihood improvement method" in SPIE Vol. 1137, Science and Engineering of Medical Imaging (1989) p.84–90, that an edge image, i.e. an image which is derived from a normal image and in which mainly the edges are shown between otherwise relatively uniform areas, has a characteristic distribution of pixel (picture element) values. According to the invention this property is used to determine a correction image which is used to correct the original image only in so far as required by insufficient information density. How the edge image has to be transformed between image-space and frequency-space will be explained in the description with reference to the drawings hereinafter of an embodiment of the invention.

In one embodiment of the invention, step a) involves
  a1) determining a second frequency image on Cartesian coordinates from said first frequency image,
  a2) determining an edge frequency image from said second frequency image by multiplication with an edge function,
  a3) Fourier transforming said edge frequency image to image-space obtaining said edge image in image-space.

By multiplying the pixel values of a frequency image with a factor which is larger according as the frequency of a pixel is larger the edges in the image (in image-space) become emphasized. Experiments which led to the present invention have shown that a real edge image is obtained by multiplication with the edge function $|\underline{k}|^\alpha$ with $0.5 < \alpha < 2.0$. Best results are obtained for certain images with $\alpha = 1.1$.

In another embodiment of the invention, step a) involves
  a1) determining a second frequency image on Cartesian coordinates from said first frequency image,
  a2) Fourier transforming said second frequency image to image-space,
  a3) determining a convolution of said Fourier transformed second frequency image with an edge function obtaining said edge image in image-space.

As mathematically speaking multiplication in the Fourier domain is equivalent to a convolution in the image domain, it is also possible to first transform the image to image-space and then convert the image in image-space to an edge image by a convolution with a suitable function. Experiments which led to the present invention have shown that an excellent edge image is obtained by a convolution of the image in image-space with the edge function $(\delta_{x,0}-\delta_{x,1})$ in the x-direction and with the corresponding function in the y-direction and if applicable in the z-direction. The pixel values of the edge image in image-space are then represented by vectors. This convolution is equivalent to subtracting from every pixel its "positive-x neighbor" value. $\delta_{x,i}$ is the Kronecker delta, being 1 only when x=i.

In a further embodiment of the invention step c) involves c1) Fourier transforming said correction image in image-space obtaining a correction image in frequency-space, c2) determining a corrected edge frequency image from said edge frequency image and said correction image in frequency-space, c3) determining said corrected frequency image from said corrected edge frequency image.

If the edge image in image-space is obtained from an edge image in frequency-space the latter is directly available for correction with the Fourier transform of the correction image to frequency-space.

However, in a another embodiment of the invention step c) involves c1) Fourier transforming said correction image in image-space obtaining a correction image in frequency-space, c2) Fourier transforming said edge image in image-space obtaining an edge frequency image, c3) determining a corrected edge frequency image from said edge frequency image and said correction image in frequency-space, c4) determining said corrected frequency image from said corrected edge frequency image.

This embodiment is in particular suitable if the edge image is obtained in image-space by a convolution with an edge function because then there is no edge image available in frequency-space. As a convolution with the function $(\delta_{x,0}-\delta_{x,1})$ is equivalent to a multiplication in frequency-space by $1-\exp(i\pi k_x)$, $k_x$ being in the range of $(-\frac{1}{2},\frac{1}{2})$, the transform in frequency-space back from edge image to normal (non-edge) image involves in a 2D case multiplication with $$(1-\exp(-i\pi k_x), 1-\exp(-i\pi k_y))/\{4-2\cos(\pi k_x)-2\cos(\pi k_y)\}$$

In an embodiment of the invention said correction image in image-space is an image constituting corrections to increase the probability of said edge image in image-space This means that the correction image contains only the corrections to be applied (with a weight factor) to the image to be corrected. Another procedure would be that the correction image is a corrected edge image which is to replace (where necessary and with a weight factor) the image to be corrected. Mathematically both procedures are practically equivalent.

In a preferred embodiment of the invention said corrected edge frequency image is a weighted combination of said edge frequency image and said correction image in frequency-space.

It would not be an optimal method to apply the calculated corrections to each pixel in frequency-space because the center of frequency-space has been sufficiently densely sampled. Therefore the corrections are applied with a weight factor which is representative for the measure of correctness of the uncorrected image. For example, the weight factor with which the corrections are multiplied, may be low, or even zero, for reliable pixel values and high for pixels resulting from interpolation with insufficient accuracy.

In an embodiment of the invention the pixel values "e'" of said correction image in image-space are determined by $e'=b \cdot 2a^2 \cdot e/(e^2+a^2)$, "e" being a picture value of said edge image obtained in step a), "a" being a half width half maximum value of a probability function of "e" and "b" being an empirical factor close to 1.

Experiments have shown that the pixel value distribution of an edge image in image-space is very close to a Lorentzian probability distribution $p(e)=a/\{\pi(e^2+a^2)\}$. Assuming that all the pixels are uncorrelated the likelihood of the total image is the product of all p(e) and it can be shown that the largest increase of this likelihood is given by a correction image (constituting the corrections) which is proportional to $2a^2 \cdot e/(e^2+a^2)$ An embodiment of the invention especially directed to making a two-dimensional image of a slice of an object comprises the steps of:

a) applying a slice selection gradient to said main field and simultaneously applying a radio-frequency excitation pulse to said object thereby exciting spin magnetic dipole moments in a slice of said object, b) applying a read gradient to said main field with a gradient direction parallel to said slice, c) sampling magnetic resonance signals during the application of said read gradient, d) storing samples as values assigned to points arranged along a radial line in a frequency-space defined on Cartesian coordinates $k_x$ and $k_y$, e) repeating steps a)–d) a predetermined number of times with different directions parallel to said slice of said read gradient, thereby obtaining a first electronic image with values arranged along radial lines said in frequency-space, f) deriving said magnetic resonance image by Fourier transformation, and is characterized in that between steps e) and f):

aa) all values of said first electronic image are processed and multiplied with substantially $|k|^\alpha$, with $0.5<\alpha<2.0$, thereby obtaining an electronic image $E(k_x,k_y)$ with values arranged along lines parallel to $k_x$ and $K_y$ in said frequency-space, bb) a Fourier transform is applied to the electronic image $E(k_x,K_y)$ to derive an electronic intermediate image $e(x,y)$ defined in an image-space on Cartesian coordinates x and y, cc) an electronic correction image e'(x,y) is formed from e(x,y) according to the formula $$e'(x,y)=b \cdot 2a^2 \cdot e(x,y)/\{(e(x,y))^2+a^2\}$$

wherein "a" is a half width half maximum value of a probability function of e(x,y) and "b" is an empirical factor close to 1, dd) e'(x,y) is transformed to said frequency-space by a Fourier transform yielding an electronic image $E'(k_x,K_y)$ ee) an electronic image $$\{E(k_x,k_y)-\beta(k_x,k_y) \cdot E'(k_x,k_y)\} |k|^{-\alpha}$$

wherein $\beta(k_x,k_y)$ is a weight factor, is determined as an input image for step f).

The invention is also directed to an apparatus comprising means to perform one of the methods described above and in particular to an apparatus comprising means to determine an edge image from an initial image, means to derive a correction image from said edge image, means for correcting in frequency-space said initial image with said correction image and means for deriving said magnetic resonance image from said corrected initial image.

BRIEF DESCRIPTION OF THE DRAWING

These and other aspects of the invention will be further explained with reference to the accompanying drawings.

The drawings show in.

DETAILED DESCRIPTION OF THE PREFERRED EMBODIMENTS

Where in the preceding or following description or in the claims the expression "image" is used, not only a visual image is meant such as it may be observed on a monitor, but also an electronic image in digital form, being processed or stored in memory means. A digital image consists of picture elements also called pixels.

An electronic image may be in image-space defined on coordinates x, y and z or in frequency-space (also called k-space) defined on coordinates $k_x$, $k_y$, and $k_z$. An image in image-space may be transformed into an image in frequency-space (and vice versa) in a manner well-known to a person skilled in the art of magnetic resonance imaging (MRI) using a so-called Fourier transform.

As is customary in this art, functions in frequency-space will be indicated with capitals and functions in image-space will be indicated in small print, unless the context requires otherwise. The Fourier transformation of a function f in image-space to a function F in frequency-space will be indicated with $F=\mathfrak{J}\{f\}$ and the Fourier transformation of a function F in frequency-space to a function f in image-space will be indicated with $f=\mathfrak{J}^{-1}\{F\}$. A convolution of two functions in image-space or in frequency-space will be indicated with $\oplus$, so: $f\oplus g$ and $F\oplus G$ respectively.

Underscored characters generally represent vectors.

As is also customary in the art of magnetic resonance imaging, the signals are sampled and digitized and the further image processing is digital. All that is implicit in this description.

The radial scan used in the present invention may be used to image an object in three dimensions (3D) or may be used to image a slice of an object in two dimensions (2D). Accordingly reference may be made to spherical coordinates (3D) or to polar coordinates (2D). The embodiment described hereinafter is a 2D imaging method for the ease of the description, but a person skilled in the art will have no difficulty in understanding how a 3D method works because the additional dimension only means more computational effort.

In the description of an embodiment hereinafter reference is made to magnetic resonance, this implies nuclear resonance which in a specific situation is proton resonance and it also implies electron spin resonance.

Magnetic resonance imaging is very useful in medical applications, that needs no further explanation. The object to be imaged is then a patient or generally a human being to be examined.

Figure 1:
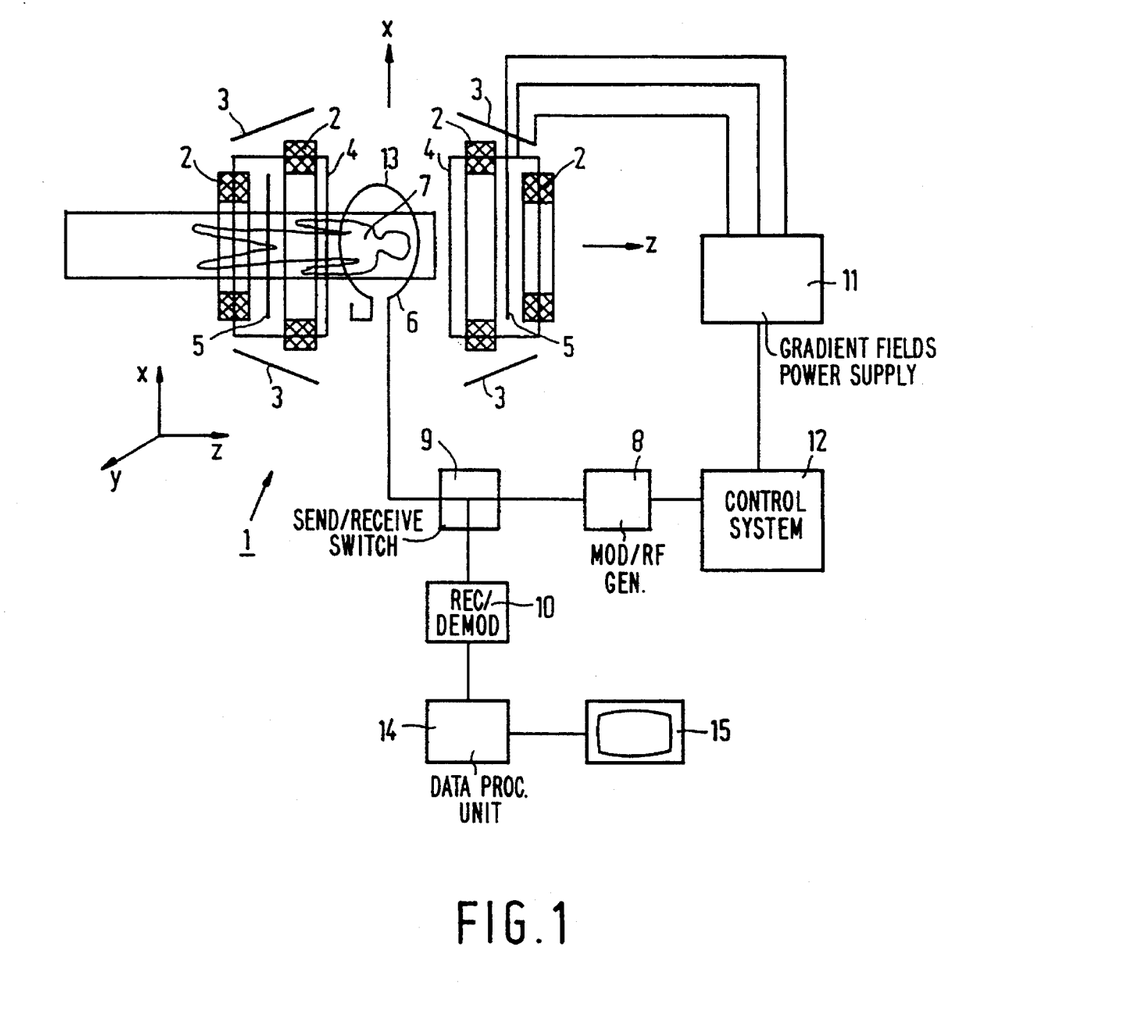
FIG. 1: diagrammatically a magnetic imaging apparatus suitable for the method of the invention.

In FIG. 1 a magnetic resonance apparatus 1 is diagrammatically shown. The apparatus comprises a set of main magnetic coils 2 for generating a stationary homogeneous main magnetic field and several sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energized via a power supply 11. The apparatus further comprises an RF coil 6 for emitting radio-frequency pulses (RF-pulses) to an object or body 7, the coil 6 being coupled to a modulator/RF generator 8 for generating and modulating of the RF-pulses. Also provided is an RF coil for receiving the NMR-signals, which coil can be RF coil 6 or a separate coil. If the coil 6 is used for both excitation and receiving, as shown in FIG. 1, a send-receive switch 9 is arranged to separate the received signals from the excitation pulses. The received magnetic resonance signals are input to receiver/demodulator 10. The modulator/RF generator 8 and the power supply 11 for the gradient coils 3, 4 and 5 are steered by a control system 12 to generate a predetermined sequence of RF-pulses and gradient field pulses. The receiver/demodulator is coupled to a data processing unit 14, for example a computer, for transformation of the received signals into an image that can be made visible, for example on a visual display unit 15.

If the magnetic resonance apparatus 1 is put into operation with an object or body 7 placed in the magnetic field, a small excess of magnetic dipole moments (nuclear or electron spins) in the body will be aligned in the direction of the magnetic field. In equilibrium, this causes a net magnetization $M_0$ in the material of the body 7, directed in parallel with the magnetic field. In the apparatus 1 the macroscopic magnetization $M_0$ is manipulated by radiating to the body RF-pulses having a frequency equal to the Larmor frequency of the dipole moments, thereby bringing the dipole moments in an exited state and re-orienting the magnetization $M_0$. By applying the proper RF-pulses, a rotation of the macroscopic magnetization is obtained, the angle of rotation is called the flip-angle. The introduction of variations in the magnetic field by applying gradient magnetic fields influences the behavior of the magnetization locally. After the application of RF-pulses, the changed magnetization will tend to return to a state of thermal equilibrium in the magnetic field, emitting radiation in the process. A well chosen sequence of RF-pulses and gradient field pulses causes this radiation to be emitted as (decaying) magnetic resonance signals which provide information about the density and/or relaxation times of a certain type of nuclei, for example hydrogen nuclei, and the substance in which they occur. By analysis of the emitted signals and presentation of it in the form of images, information about the internal structure of the object or body 7 is accessible. The decaying magnetic resonance signal directly after the excitation is called FID (Free Induction Decay). By proper application of the gradients and/or application of additional excitation (RF) pulses also an echo of the FID may be produced and used to derive image information.

The fundamental expression governing magnetic resonance imaging is $\omega=\gamma B$, meaning that the (local) Larmor frequency $\omega$ is the gyromagnetic ratio $\gamma$ times the (local) magnetic field B. Information about the position is obtained via the gradients which may be superimposed on the homogeneous main field. As mentioned herein before it has been shown that the values of the magnetic resonance signal S(t) correspond to the values of the Fourier transform of the spin density function in frequency-space at positions given by d$\underline{k}/dt=\gamma\underline{G}$, with $\underline{k}=(k_x,k_y,k_z)$ determining the position in frequency-space and $\underline{G}=(G_x,G_y,G_z)$ determining the magnetic gradient.

For a more detailed description of magnetic resonance imaging (MRI) and MRI-devices reference is made to the extensive literature on this subject, for example to the book "Practical NMR Imaging", edited by M. A. Foster and J. M. S. Hutchinson, 1987, IRL Press.

Figure 2:
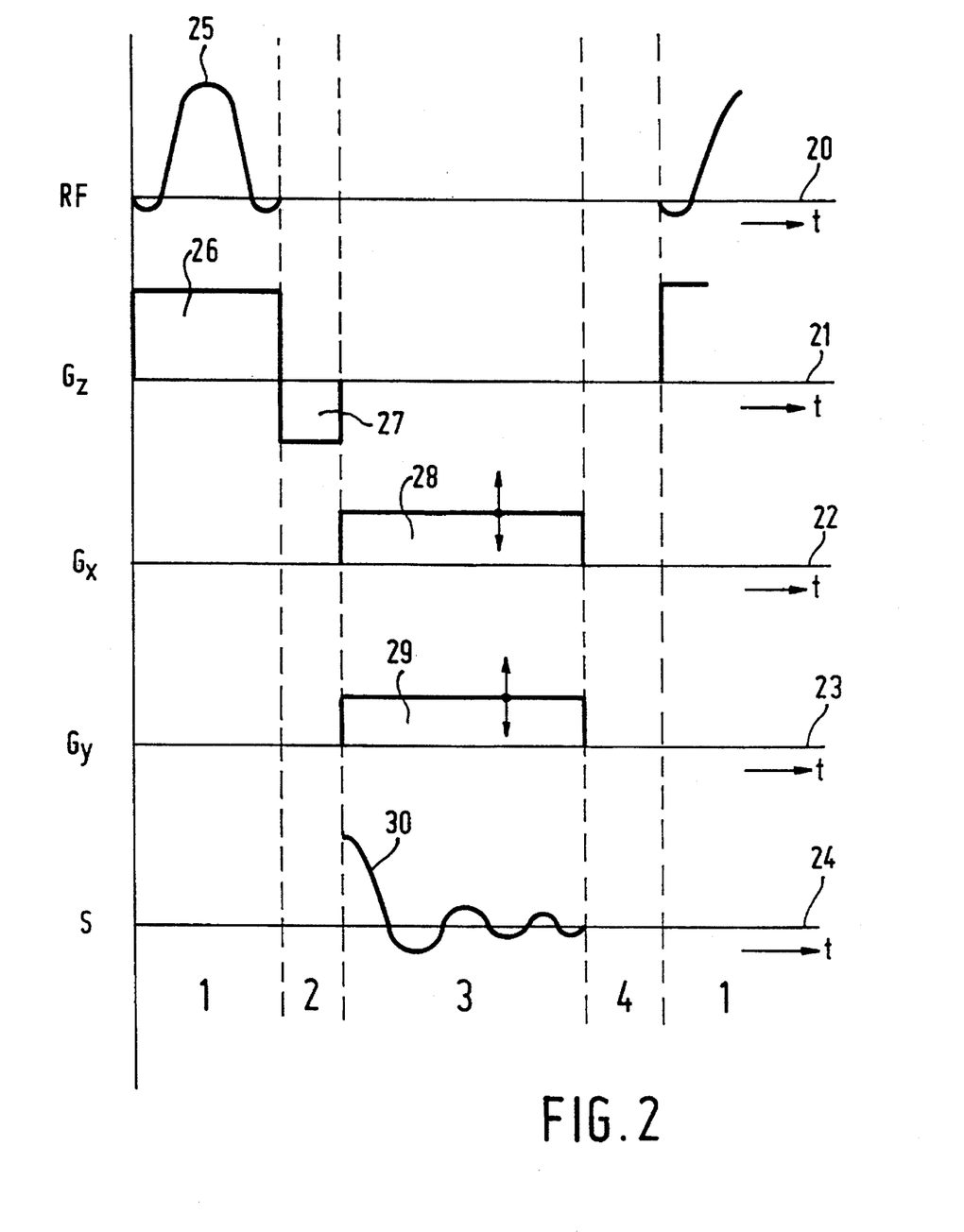
FIG. 2: a sequence of RF and gradient pulses suitable for the method of the invention.

In FIG. 2 a sequence of RF and gradient pulses is shown which is used in a 2D magnetic resonance method with radial scan. On time axes 20, 21, 22, 23 and 24 respectively are shown the envelope of the RF pulse, slice selection gradient $G_z$, gradients $G_x$ and $G_y$ which together determine the amplitude and direction of a read gradient and magnetic resonance signal S. One radial scan comprises three time intervals indicated as 1, 2 and 3. After a waiting interval 4 the following radial scan starts again with an interval 1. The waiting interval 4 may be left out.

During interval 1 a slice in the object to be examined is excited. The position and thickness of the slice is determined by the frequency spectrum of the RF pulse 25 of which only the envelope is shown and the amplitude of slice selection gradient $G_z$. The slice is perpendicular to $G_z$. The known rephasing lobe 27 of the slice selection gradient (interval 2) serves to achieve a well defined phase of all the spins throughout the thickness of the slice. The read gradient formed by gradients $G_x$ and $G_y$ (28 and 29) determines the direction of the radial scan, i.e. the direction of $\underline{k}$ determined by angle $\phi$ in FIG. 3. During interval 3 the magnetic resonance signal 30 is detected and sampled. The values of the samples are assigned to positions in k-space corresponding to the expression $\underline{k}=\gamma\underline{G}t$. Generally one will take $|\underline{G}|=\sqrt{(G_x^2+G_y^2)}=$constant so that each radial scan is passed through with the same speed. $\phi$ is determined by $tg(\phi)=G_y/G_x$.

Figure 3:
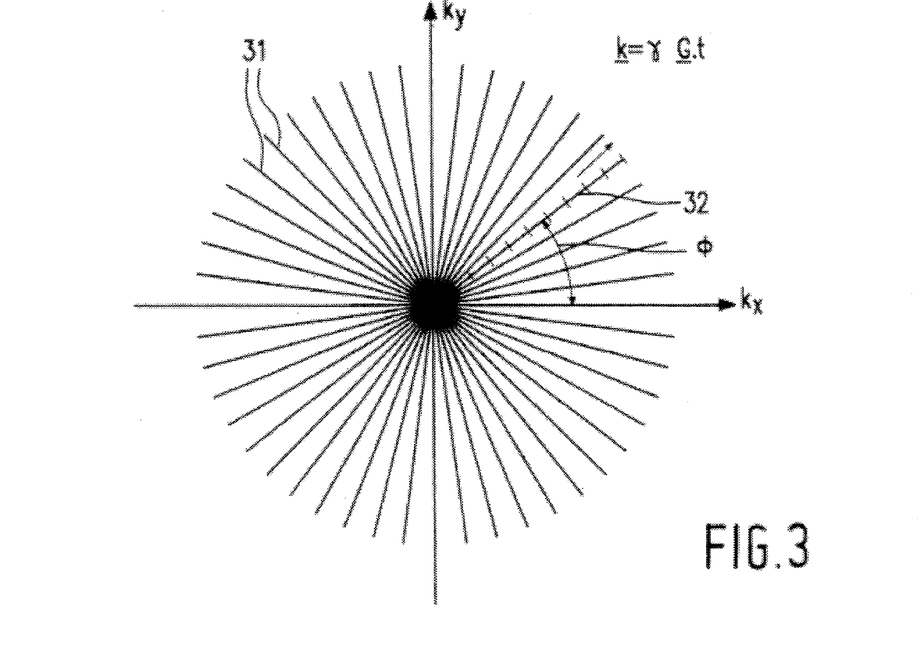
FIG. 3: a representation of radial scan in k-space.

FIG. 3 is a representation of k-space. A number of radial scans 31 are indicated. On radial scan 32 schematically the positions of some measured samples are shown. Each radial scan may start with a very short scan in the opposite direction in order to better detect the very beginning of the free induction decay in the form of an echo. Although the radial scans are shown equidistant (the same $\Delta\phi$ between the scans) this is not essential. If the object under investigation is oblong then it may be advantageous to have a higher sample density in the length direction, i.e. a smaller $\Delta\phi$ in the length direction of the object then in the direction perpendicular thereto.

FIG. 4 is again a representation of k-space. As will be apparent, there are areas 41 of larger $|\underline{k}|=\sqrt{(k_x^2+k_y^2)}$ where k-space is insufficiently filled with data. As large $|\underline{k}|$ corresponds to the higher frequencies in the image, the reproduction of the finer image details is in jeopardy. Supposing the unknown data are zero causes artefacts in the image displayed.

Figure 4:
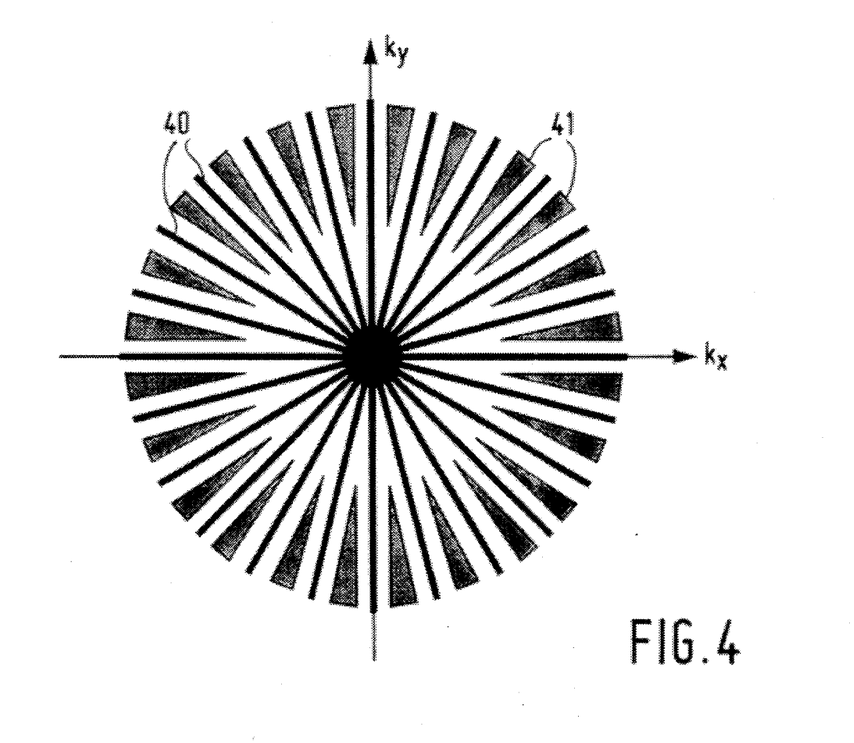
FIG. 4: a representation of radial scan in k-space.

After k-space has been completely scanned, the data as a function of $\underline{k}$ determined by coordinates $|\underline{k}|$ and $\phi$ are transformed to Cartesian (rectangular) coordinates $k_x$ and $k_y$.

A simple approach would be interpolation but more sophisticated methods are available and give much better results. In the embodiment here described a so-called gridding algorithm is used which implies convolution with a sinc function followed by resampling. One such gridding algorithm is described in the article "A Fast Sinc Function Gridding Algorithm for Fourier Inversion in Computer Tomography" in IEEE Transactions on Medical Imaging, Vol. MI4, No. 4, December 1985, p. 200–207.

After gridding, the values now on $k_x$, $k_y$ coordinates are multiplied with $|\underline{k}|^\alpha$ with $\alpha=1.1$. The value of $\alpha$ has to be determined empirically and may lie between 0.5 and 2.0. Also in a 3D method $\alpha$ need not to be much larger than 1 although intuitively one would expect a higher value. The purpose is to obtain an image which after Fourier transformation to image-space is an edge image, i.e. an image in which only the edges between relatively uniform areas are shown. As determining an edge image is a kind of differentiation of the image and in one dimension differentiation is equivalent to multiplication with k in k-space, one may expect that multiplication with some power of $|\underline{k}|$ may result in a usable edge image in image-space. Gridding and multiplication with $|\underline{k}|^\alpha$, not necessarily but preferably in that order, yield an edge image $E(k_x,k_y)$ in k-space and after transformation to image-space an edge image $e(x,y)$.

It is known that such an edge image like $e(x,y)$ has a characteristic distribution of pixel values. This distribution is not Gaussian as one would expect perhaps in first instance but more Lorentzian. See e.g. the article about ringing artefact reduction in SPIE Vol. 1137 (1989) mentioned here in before. However, because the edge image obtained is based on insufficient data (caused by the radial scan) it contains all kinds of artefacts. On the other hand, the amplitude of these artefacts appears to be relatively small because the center of k-space was sufficiently sampled. As, because of the multiplication with $|\underline{k}|^\alpha$ in k-space, the uniform areas of $e(x,y)$ have relatively low pixel amplitudes and the edges have relatively high pixel amplitudes, there is a range of pixel amplitudes which are less likely to belong to a correct edge image and more likely to belong to undesired artefacts. Experiments have shown that suppressing to a certain extent intermediate pixel values is an effective method to correct an edge image affected with such artefacts. Analogous to said ringing artefact reduction a correction image $e'(x,y)$ is determined from $e(x,y)$ according to the formula $$e'(x,y)=b \cdot 2a^2 \cdot e(x,y)/\{(e(x,y))^2+a^2\}$$

In this expression is "a" the half width half maximum value of the Lorentzian probability distribution and "b" an empirical factor close to 1. "a" may depend on the type of image and the way the edge image is derived from it. Good results have been obtained with "a" close to 1.7 times the average value of the absolute values of $e(x,y)$.

However, it would not be an optimal method if the corrected edge image would be simply obtained as $e(x,y)-e'(x,y)$. According to the invention use is made of the understanding that the Fourier transform of $e'(x,y)$ to k-space, $E'(k_x,k_y)$, ideally should be zero on positions in k-space with sufficient sampling density. This ideal is not reached, therefore, $e'(x,y)$ is first transformed to k-space yielding $E'(k_x,k_y)$. Then, in k-space, $E'(k_x,k_y)$ is multiplied with a weight factor $\beta(k_x,k_y)$ and the product is subtracted as a correction image from $E(k_x,k_y)$. This result is multiplied with $|\underline{k}|^{-\alpha}$ in order to go back from edge image to normal image in k-space. This final image in k-space is then Fourier transformed to image-space in order to obtain the desired improved image.

The weight factor $\beta(k_x,k_y)$ can be determined in various ways. One can take $\beta=0$ in areas of k-space with sufficient sampling density and $\beta=1$ elsewhere. Known gridding methods also provide information about the density of neighboring measured data. Then one can determine an auxiliary army on $k_x,k_y$ coinciding with the image data points and containing a reliability factor $w(k_x,k_y)$ which approaches 1 in areas with sufficient sampling density and approaches 0 in areas where all sampling points are far away. Good results have been obtained by taking $$\beta(k_x,k_y)=0.5^4/(w(k_x,k_y))^4+0.5^4)$$

as a continuous weight factor.

Artefacts due to "missing data" are not necessarily removed in a single iteration. One of the reasons is that the artefacts in the uncorrected image may be so large that they are seen, with relatively high likelihood, as belonging to actual image structures. In that case, the first iteration only manages to slightly reduce the artefacts. Experiments leading to the present invention have shown that this slight improvement of the distinction between artefacts and real edges makes it possible to improve the correction with the application of (a) following iteration(s).

Another promising way to use the present invention is to present the edge values e(x,y) by a vector instead of scalar value. This vector $\underline{e}(x,y)=(e_x(x,y),e_y(x,y))$ represents the image intensity gradient on every location in image-space. The Fourier transform of such a vector $\Im\{\underline{e}(x,y)\}=\underline{E}(k_x,k_y)$ can be seen as $\underline{E}(k_x,k_y)=(\Im\{e_x(x,y)\},\Im\{e_y(x,y)\})$. This embodiment of the invention can be seen as replacing the multiplication with $|\underline{k}|^\alpha$ by a multiplication with $\underline{k}=(k_x,k_y)$. The inversion of the multiplication with $\underline{k}$ is a multiplication with $\underline{k}/|\underline{k}|^2$. The correction image is then determined by $$\underline{e}'(x,y)=b\cdot 2a^2\cdot \underline{e}(x,y)/\{|\underline{e}(x,y)|^2+a^2\}$$

These and other modifications of the methods described make use of the essence of the invention.

Figure 5:
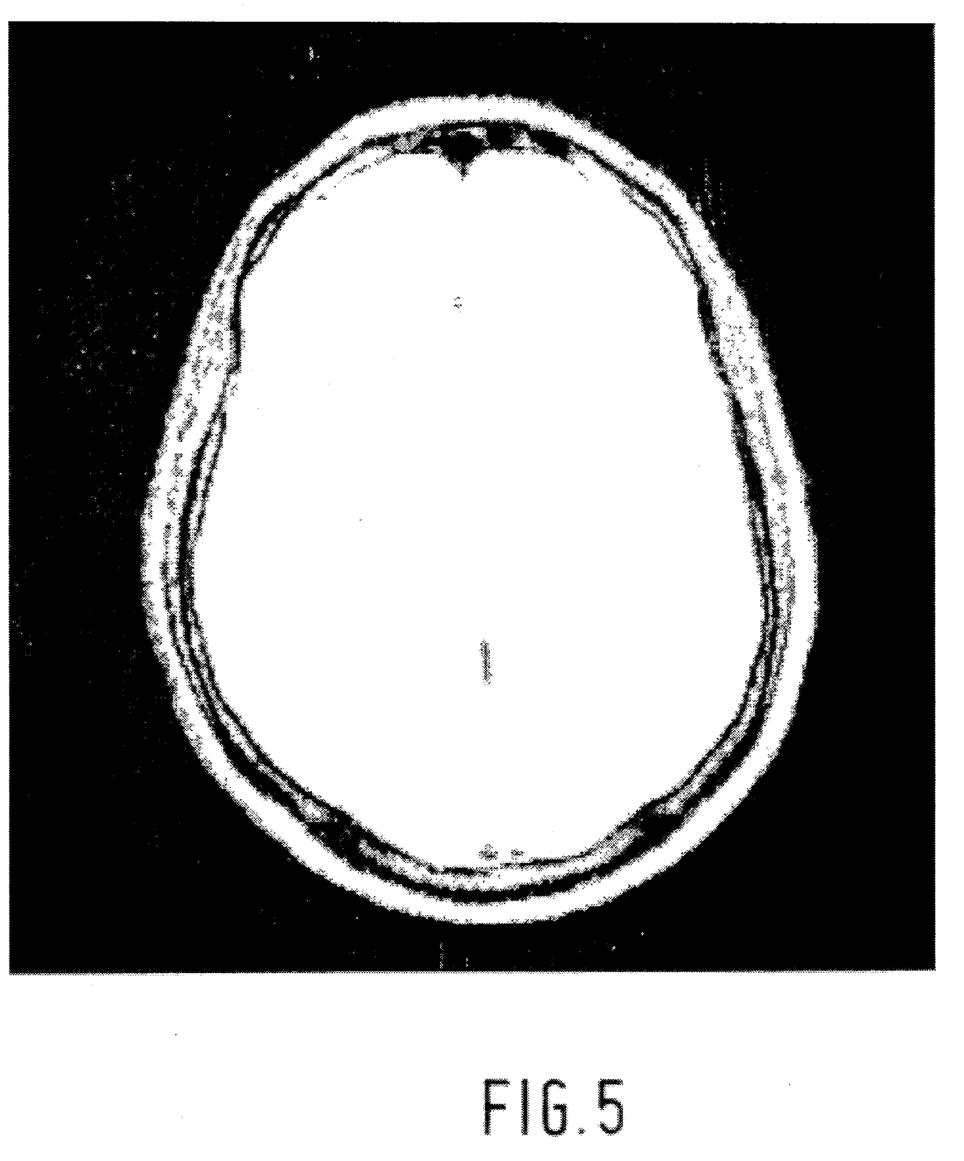
FIG. 5: a radial scan image showing some artefacts caused by radial scan with insufficient resolution of the higher image frequencies

FIG. 5 shows a 2D transaxial head scan obtained with radially scanning through frequency-space along 180 radii (2° intervals). Apparent are so called streaks radiating from structures in the image. These artefacts can be removed to a large extent if the present invention is used. Because the artefacts are hardly detectable on a low resolution medium as a photocopy a corresponding image with reduced artefacts is not shown.

Finally, it should be remarked that in an electron spin resonance (ESR) imaging method with relaxation times of the order of 1 μs slice selection techniques are not appropriate. Then a 3D radial scan method often will be used and a method according to the invention will be very useful.

We claim:

1. Method for deriving a magnetic resonance image of an object when placed in a stationary and substantially homogeneous magnetic main field, comprising repeatedly exciting said object to emit magnetic resonance signals and sampling the emitted magnetic resonance signals in the presence of a read gradient superimposed on said main field, which read gradient is rotated to radially scan through frequency space, determining a first frequency image of said object on radius and angle coordinates, and performing the steps of:

a) determining an edge image in image-space, b) deriving from said edge image a correction image in image-space with pixel values derived from pixel values of said edge image and a predetermined probability function of edge image values, c) determining a corrected frequency image in frequency-space, d) Fourier transforming said corrected frequency image to image-space.

2. Method as claimed in claim 1, wherein step a) involves:

a1) determining a second frequency image on Cartesian coordinates from said first frequency image, a2) determining an edge frequency image from said second frequency image by multiplication with an edge function, a3) Fourier transforming said edge frequency image to image-space obtaining said edge image in image-space.

3. Method as claimed in claim 1, wherein step a) involves:

a1) determining a second frequency image on cartesian coordinates from said first frequency image, a2) Fourier transforming said second frequency image to image-space, a3) determining a convolution of said Fourier transformed second frequency image with an edge function obtaining said edge image in image-space.

4. Method as claimed in claim 2, wherein step c) involves:

c1) Fourier transforming said correction image in image-space obtaining a correction image in frequency-space, c2) determining a corrected edge frequency image from said edge frequency image and said correction image in frequency-space, c3) determining said corrected frequency image from said corrected edge frequency image.

5. Method as claimed in claim 3, wherein step c) involves:

c1) Fourier transforming said correction image in image-space obtaining a correction image in frequency-space, c2) Fourier transforming said edge image in image-space obtaining an edge frequency image, c3) determining a corrected edge frequency image from said edge frequency image and said correction image in frequency-space, c4) determining said corrected frequency image from said corrected edge frequency image.

6. Method as claimed in claim 1, wherein said correction image in image-space is an image constituting corrections to increase the probability of said edge image in image-space.

7. Method as claimed in claim 4, wherein said corrected edge frequency image is a weighted combination of said edge frequency image and said correction image in frequency-space.

8. Method as claimed in claim 1, wherein pixel values "e'" of said correction image in image-space are determined by $e'=b\cdot 2a^2\cdot e/(e^2+a^2)$, "e" being a picture value of said edge image obtained in step a), "a" being a half width half maximum value of a probability function of "e" and "b" being an empirical factor close to 1.

9. Method for deriving a magnetic resonance image of an object placed in a stationary and substantially homogeneous magnetic main field, comprising the steps of:

a) applying a slice selection gradient to said main field and simultaneously applying a radio-frequency excitation pulse to said object thereby exciting spin magnetic dipole moments in a slice of said object, b) applying a read gradient to said main field with a gradient direction parallel to said slice, c) sampling magnetic resonance signals during the application of said read gradient, d) storing samples as values assigned to points arranged along a radial line in a frequency-space defined on cartesian coordinates $k_x$ and $k_y$, e) repeating steps a)–d) a predetermined number of times with different directions parallel to said slice of said read gradient, thereby obtaining a first electronic image with values arranged along radial lines said in frequency-space, f) deriving said magnetic resonance image by Fourier transformation, wherein between steps e) and f):

aa) all values of said first electronic image are processed and multiplied with substantially $|k|^\alpha$, with $0.5 < \alpha < 2.0$ and $|k| = \sqrt{(k_x^2 + k_y^2)}$, thereby obtaining an electronic image $E(k_x, k_y)$ with values arranged along lines parallel to $k_x$ and $k_y$ in said frequency-space, bb) a Fourier transform is applied to the electronic image $E(k_x, k_y)$ to derive an electronic image $e(x,y)$ defined in image-space on cartesian coordinates x and y, cc) an electronic correction image $e'(x,y)$ is formed from $e(x,y)$ according to the formula $$e'(x,y) = b \cdot 2a^2 \cdot e(x,y) / \{(e(x,y))^2 + a^2\}$$

wherein "a" is a half width half maximum value of a probability function of $e(x,y)$ and "b" is an empirical factor close to 1, dd) $e'(x,y)$ is transformed to said frequency-space by a Fourier transform yielding an electronic image $E'(k_x, k_y)$ ee) an electronic image $$\{E(k_x,k_y) - \beta(k_x,k_y) \cdot E'(k_x,k_y)\} \cdot |k|^{-\alpha},$$

wherein $\beta(k_x, k_y)$ is a weight factor, is determined as an input image for step f).

10. Method as claimed in claim 2, wherein said correction image in image-space is an image constituting corrections to increase the probability of said edge image in image-space.

11. Method as claimed in claim 3, wherein said correction image in image-space is an image constituting corrections to increase the probability of said edge image in image-space.

12. Method as claimed in claim 4, wherein said correction image in image-space is an image constituting corrections to increase the probability of said edge image in image-space.

13. Method as claimed in claim 5, wherein said correction image in image-space is an image constituting corrections to increase the probability of said edge image in image-space.

14. Method as claimed in claim 5, wherein said corrected edge frequency image is a weighted combination of said edge frequency image and said correction image in frequency-space.

15. Method as claimed in claim 13, wherein said corrected edge frequency image is a weighted combination of said edge frequency image and said correction image in frequency-space.

16. Apparatus for deriving a magnetic resonance image of an object when placed in a stationary and substantially homogeneous magnetic main field, comprising means for repeatedly exciting said object to emit magnetic resonance signals, means for forming a read gradient superimposed on said main field, which read gradient is rotated to radially scan through frequency space, means for sampling the emitted magnetic resonance signals in the presence of said read gradient superimposed on said main field, and processing means for determining a first frequency image of said object on radius and angle coordinates and for:

a) determining an edge image in image-space, b) deriving from said edge image a correction image in image-space with pixel values derived from pixel values of said edge image and a predetermined probability function of edge image values, c) determining a corrected frequency image in frequency-space, and d) Fourier transforming said corrected frequency image to image-space.

* * * * *